(12) United States Patent
Gaudin et al.

(10) Patent No.: US 7,729,231 B2
(45) Date of Patent: Jun. 1, 2010

(54) RECORDING DEVICE WITH A POROUS HEAT BARRIER

(75) Inventors: Gilles Gaudin, Grenoble (FR); Emmanuelle Algre, Grenoble (FR); Jean-Pierre Nozieres, Corenc (FR); Ahmad Bsiesy, Saint Martin d'Heres (FR)

(73) Assignees: Commissariat A l'Energie Atomique, Paris (FR); Centre National de la Recherche Scientifique, Paris (FR)

( * ) Notice: Subject to any disclaimer, the term of this patent is extended or adjusted under 35 U.S.C. 154(b) by 791 days.

(21) Appl. No.: 11/597,626

(22) PCT Filed: May 24, 2005

(86) PCT No.: PCT/FR2005/050355
§ 371 (c)(1),
(2), (4) Date: Nov. 27, 2006

(87) PCT Pub. No.: WO2005/119672
PCT Pub. Date: Dec. 15, 2005

(65) Prior Publication Data
US 2009/0016207 A1 Jan. 15, 2009

(30) Foreign Application Priority Data
May 28, 2004 (FR) ................................ 04 51068

(51) Int. Cl.
*G11B 7/00* (2006.01)

(52) U.S. Cl. .................................................... 369/283

(58) Field of Classification Search ...................... None
See application file for complete search history.

(56) References Cited

U.S. PATENT DOCUMENTS

| 4,032,691 A | | 6/1977 | Kido et al. |
| 4,343,993 A | | 8/1982 | Binnig et al. |
| 4,724,318 A | | 2/1988 | Binnig |
| 4,737,934 A | | 4/1988 | Ross et al. |
| 5,115,424 A | * | 5/1992 | Nakajima et al. ........ 369/275.4 |

(Continued)

FOREIGN PATENT DOCUMENTS

EP 0 526 234 2/1993

(Continued)

OTHER PUBLICATIONS

J. Moritz, et al., "Patterned Media Made From Pre-Etched Wafers: A Promising Route Toward Ultrahigh-Density Magnetic Recording", IEEE Transactions on Magnetics, vol. 38, No. 4, Part 1, XP 001124664, pp. 1731-1736, 2002.

(Continued)

*Primary Examiner*—Allen T Cao
(74) *Attorney, Agent, or Firm*—Oblon, Spivak, McClelland, Maier & Neustadt, L.L.P.

(57) ABSTRACT

This invention relates to a recording medium comprising:
a substrate (21) made of a material, provided with pads,
a layer of recording material (23) deposited on top of the pads,
thermal insulation zones (22a) in at least one part of the pads and/or substrate.

20 Claims, 5 Drawing Sheets

U.S. PATENT DOCUMENTS

| | | | |
|---|---|---|---|
| 5,353,268 A | 10/1994 | Hintz | |
| 6,771,567 B2 | 8/2004 | Nozieres et al. | |
| 6,950,385 B1 * | 9/2005 | Chiba et al. | 369/126 |
| 7,586,828 B1 * | 9/2009 | Ma | 369/126 |
| 2003/0011922 A1 | 1/2003 | Nozieres et al. | |
| 2003/0096077 A1 | 5/2003 | Ju et al. | |
| 2005/0047206 A1 | 3/2005 | Nozieres et al. | |

FOREIGN PATENT DOCUMENTS

| | | |
|---|---|---|
| EP | 0 926 724 | 6/1999 |
| EP | 1 381 031 | 1/2004 |
| FR | 2 802 011 | 6/2001 |
| JP | 63 266649 | 11/1988 |
| JP | 04 344 348 | 11/1992 |
| JP | 07287866 A * | 10/1995 |

OTHER PUBLICATIONS

Te-Ho Wu, et al., "Magnetic Domain Pinning in Patterned Magneto-Optical Material", Journal of Applied Physics, vol. 85, No. 8, XP 012047643, 1999.

D. M. Eigler, et al., "Positioning Single Atoms With a Scanning Tunnelling Microscope", Letters to Nature, vol. 344, pp. 524-526, 1990.

P. Vettiger, et al., "The "Millipede" More Than One Thousand Tips for Future AFM Data Storage", IBM Journal of Research and Development, vol. 44, No. 3, pp. 323-340, 2000.

S. Landis, et al., "Domain Structure of Magnetic Layers Deposited on Patterned Silicon", Applied Physics Letters, vol. 75, No. 16, pp. 2473-2475, 1999.

Stephen Y. Chou, et al., "Imprint Lithography With 25-Nanometer Resolution", Science, vol. 272, pp. 85-87, 1996.

G. Gesele, et al., "Temperature-Dependent Thermal Conductivity of Porous Silicon", Journal of Physics, vol. 30, pp. 2911-2916, 1997.

A. N. Obraztsov, et al., "Photoacoustic Spectroscopy of Porous Silicon", Semiconductors, vol. 31, No. 5, pp. 534-537, 1997.

* cited by examiner

RECORDING DEVICE WITH A POROUS HEAT BARRIER

TECHNICAL FIELD AND PRIOR ART

The invention relates to the technical field of recording devices or media, and methods of making them.

The recent development of microscopy techniques with local probes such as Scanning Tunneling Microscopy or STM (U.S. Pat. No. 4,343,993), Atomic Force Microscopy or AFM (U.S. Pat. No. 4,724,318), and Scanning Near-field Optical Microscopy (SNOM) have enabled the observation of surfaces with resolutions measured in nanometers, that can be used for the observation and displacement of atoms in the case of STM (Nature 344, 524-526 (1990)).

This high resolution has been used in proposals for very high-density memories using these techniques.

The objective is to bring a tip very close to the writing media, typically within a few nanometers. In this description, the terms tip and probe are generic and both correspond to a modified or unmodified AFM tip, an STM tip or even a drawn optical fiber, and other variants.

The principle is to use this probe to make local modifications to a material and thus record information.

The most widespread technique consists of heating a material locally as to modify its properties.

For example, these properties may be mechanical as for an indent to a polymer layer by a heating tip (thermomechanical recording, described in IBM Journal of Research and Development, May 2000, IBM, USA, Vol. 44 num. 3, 323-340), or structural in the case of a phase change material such as $Ge_2Sb_2Te_5$ for which a phase change between a crystalline state and an amorphous state takes place.

They may also be magnetic, in the case in which heating locally reduces the write field to values less than the fields applied.

This principle of writing by local heating faces heat loss problems: both lateral and in-depth towards the substrate that supports the recording layer. Lateral losses will create loss of resolution because heat diffusing outside the chosen area will widen the written point; lateral losses and in-depth losses both create a loss of energy that has to be compensated by the source, in this case the probe.

This problem is particularly important if the layer on which information is recorded is a good thermal conductor, for example in the case of thermomagnetic recording in which the magnetic storage layers are metallic.

Energy losses may be compensated by the probe so as to reach the required temperature at the writing point in the recording layer.

However, the combined effect of these lateral and in-depth losses may make it impossible to achieve the temperature increase on the media necessary for recording data.

FIG. 1 shows an example of the temperature increase as a function of time, for a pad heated with a given power density for 5 μs. The calculation was done using finite elements for three materials with thermal conductivities equal to 13 $Wm^{-1}K^{-1}$ (curve 01), 1.48 $Wm^{-1}K^{-1}$ (silica, curve 02), 0.1 $Wm^{-1}K^{-1}$ (for example a plastic or polymer, curve 03) respectively.

Even if the probe can transfer sufficient power towards the media, thermal losses will cause higher energy consumption. Energy consumption is a very important data for memories under tips that will be used particularly in portable devices.

One approach towards solving these problems consists of inserting lateral and in-depth thermal barriers in the medium.

FIG. 2 shows an example of such an embodiment with a substrate 11, a recording material 12, a thermal insulating material 13 creating lateral barriers and a thermal insulating material 14 that may be different from the material 13 and that provides thermal insulation towards the substrate.

Manufacturing of such a structure, particularly lateral barriers 13 composed of a thermal insulating material different from the recording material 12, is technologically difficult.

The problem relates to the case of thermally assisted recording. But it also relates to cases of magnetic or electrical recordings in which the write/read phenomenon (for example by current circulation) may also induce a temperature increase that makes correct operation more difficult.

Therefore, the problem arises of providing a new recording device or support with thermal assistance or another means.

Such a support is preferably easy to make and is compatible with most recording materials (magnetic, with phase change, polymers, etc.).

PRESENTATION OF THE INVENTION

The invention relates firstly to a recording device comprising:
  a substrate made of a material, provided with pads,
  a layer of recording material deposited on top of the pads,
  thermal insulation zones, located in at least one part of the substrate and/or pads.

The pads may belong to a layer transferred onto the substrate; the pads and the substrate may also be made of a single material.

The material may be a semiconductor, for example silicon or germanium (Ge), or germanium silicide (SiGe), or silicon carbide (SiC), or gallium arsenide (GaAs), or indium phosphide (InP) or gallium phosphide (GaP).

Thermal insulation zones may be porous zones in the semiconducting material.

Thus, insulation zones may be lateral and/or facing the substrate.

Spaces between pads may also comprise thermally insulating material.

The recording material may for example be made of a magnetic material with phase change or a polymer.

Thermal insulation zones may have a thermal conductivity of between 20 $W.m^{-1}.K^{-1}$ and 0.01 $W.m^{-1}.K^{-1}$.

A device or support according to the invention may be used by most thermally assisted recording techniques like those using a hot tip or optical techniques in near field or in far field.

Therefore, the invention also relates to a recording device comprising a recording support like that described above, and optical heating means.

It also relates to a recording device comprising a recording support like that described above, and comprising a heating tip.

The heating tip may for example be of the AFM or STM type, with or without contact.

The device or support according to the invention can also be easily made using standard technologies, of the silicon type and particularly CMOS compatible.

The invention also relates to a process for making a recording medium comprising:
  production of pads on a substrate made of a material,
  formation of thermal insulation zones in the pads and/or the substrate,
  formation of a layer of recording material on the pads.

The pads may be made in the substrate; the pads may also be made in a layer added onto the substrate.

The material may be semiconducting, for example silicon or germanium (Ge), or germanium silicide (SiGe), or silicon carbide (SiC), or gallium arsenide (GaAs), or indium phosphide (InP) or gallium phosphide (GaP).

Thermal insulation zones may be obtained by porosification of the semiconducting material, for example by anode oxidation or immersion in an acid bath.

DETAILED PRESENTATION OF PARTICULAR EMBODIMENTS

Figure 1:
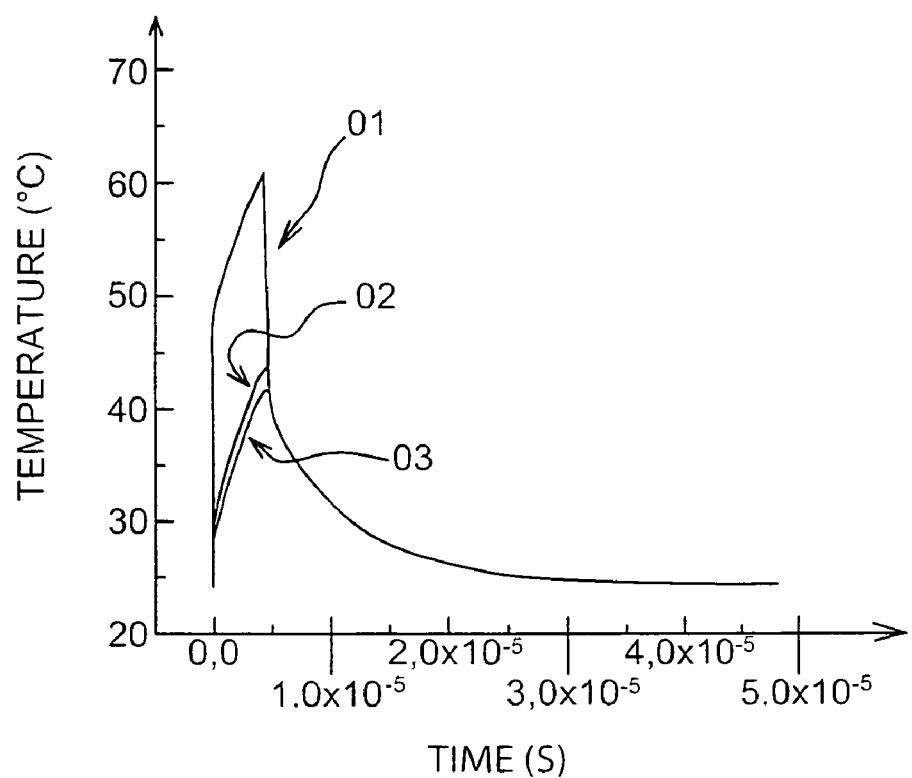
FIG. 1 shows calculation results for the temperature increase in three materials with different conductivities.
Figure 2:
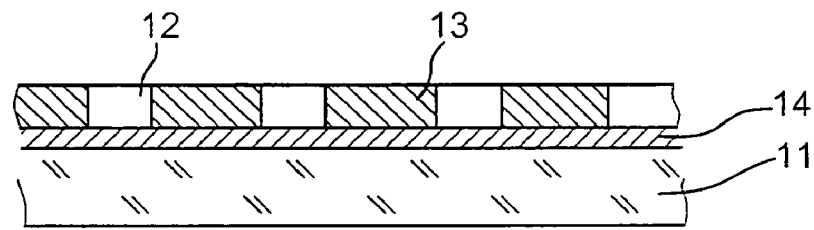
FIG. 2 shows a known recording structure, FIGS. 3A-3C and 3A'-3C' illustrate different embodiments of the invention, FIGS. 4A and 4B diagrammatically show devices for making the process according to the invention.

A device or support or medium according to the invention will be described with reference to FIGS. 3A-3C.

This structure comprises a silicon substrate 21 in which pads 27 are etched. The structure is then made in a single piece.

For example, the pads have a diameter of 90 nm and they are arranged at a pitch of 180 nm.

In order to obtain standard densities (terabit/inch$^2$), the pads may be arranged at a pitch of between 20 nm and 50 nm, for example 25 nm (for example pad diameter 20 nm at a spacing of 5 nm).

In height, a shape factor of $$2\left(\frac{h}{\phi}=2\right)$$

is preferable to increase the distance between the top of the pad and the bottom between the pads.

Some of the silicon is then made porous, for example using a technique involving an electrolytic bath, as described later:
- either throughout the height of the pads and in part of the substrate (zone 22a, FIG. 3),
- or in the substrate only (zone 22b) keeping the silicon pads in a non-porous state (FIG. 3B),
- or in only a part of the pads (zone 22c, FIG. 3C), advantageously at the top of the pads.

A recording material 23 is placed on the structures thus made.

The air in the spaces 24 between the pads may be replaced by a material providing good thermal insulation.

Replacing air by a material will reduce the thermal insulation. But it may be useful to partially or completely fill in the spaces 24 in order to keep the device plane or to provide mechanical reinforcement, for example using:
- a resin (polymer) spread by spin coating,
- or an oxide (S$_r$O$_2$) deposited in the chemical or solid phase.

The invention has been described using silicon as an example of the material.

Other semiconducting materials such as germanium (Ge), or germanium silicide (SiGe), or silicon carbide (SiC), or gallium arsenide (GaAs), or indium phosphide (InP) or gallium phosphide (GaP) may be made porous (also by electrolytic bath) and used instead of silicon. Furthermore, these porous materials have a better electrical insulation than non-porous semiconductors.

Silicon is compatible with microelectronic technologies and particularly CMOS technologies.

Therefore, it is possible to make electrical barriers with porous silicon, particularly because porous silicon oxidizes much more easily than solid silicon, which further increases the electrical resistivity.

This is useful particularly for systems writing by circulation of an electric current.

Finally, other materials that are not necessarily semiconductors, can be used.

Figure 3A:
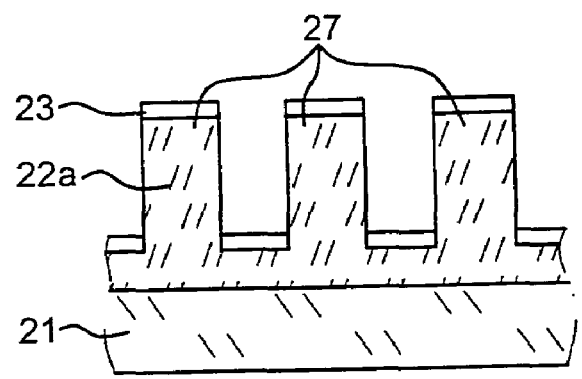
Figure 3B:
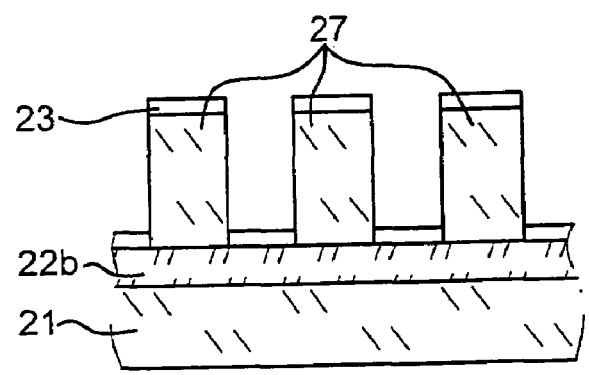

FIGS. 3A', 3B' and 3C' show another embodiment in which a silicon layer 52 in which the pads have been made is deposited or transferred onto a support 50. This layer 52 may be modified as described above (for example it may be made porous) with relation to FIGS. 3A to 3C and it may be formed of the same materials as the substrate 21.

A process for manufacturing a medium according to the invention will now be described, using silicon as an example. But the process may be applied to other materials.

Firstly, is to make structured media are made from silicon, for example by choosing the doping depending on the degree of thermal insulation required for the substrate in later stages.

Any method may be used to make these structured substrates, for example such as the use of standard silicon techniques such as ultraviolet lithography, or extreme ultraviolet or electronic lithography, followed by etching of silicon, for example such as anisotropic reactive anionic etching (Appl. Phys. Lett. 75 (1999) 2473-2475); or nano-printing techniques using or not using a lift-off process (for example as described in Science (1996) 85-87) followed by silicon etching as described above.

These silicon media are then made porous by anodic oxidation in a hydrofluoric acid (HF) medium. The silicon substrate represents the anode of an electrolytic cell containing an HF/ethanol solution provided with a platinum counter-electrode (cathode).

The electrical contact on the silicon substrate is obtained on its back face by a previously deposited aluminium layer.

In the case of a transferred or deposited layer, the support 50 will be chosen to be semiconducting or conducting and if necessary, a deposit of an additional conducting layer will be made on its back face.

Such a contact may also be provided by second electrolytic bath containing a conducting solution that is chemically inert with regard to silicon. This contact will be used when a back face illumination is necessary.

Figure 4A:
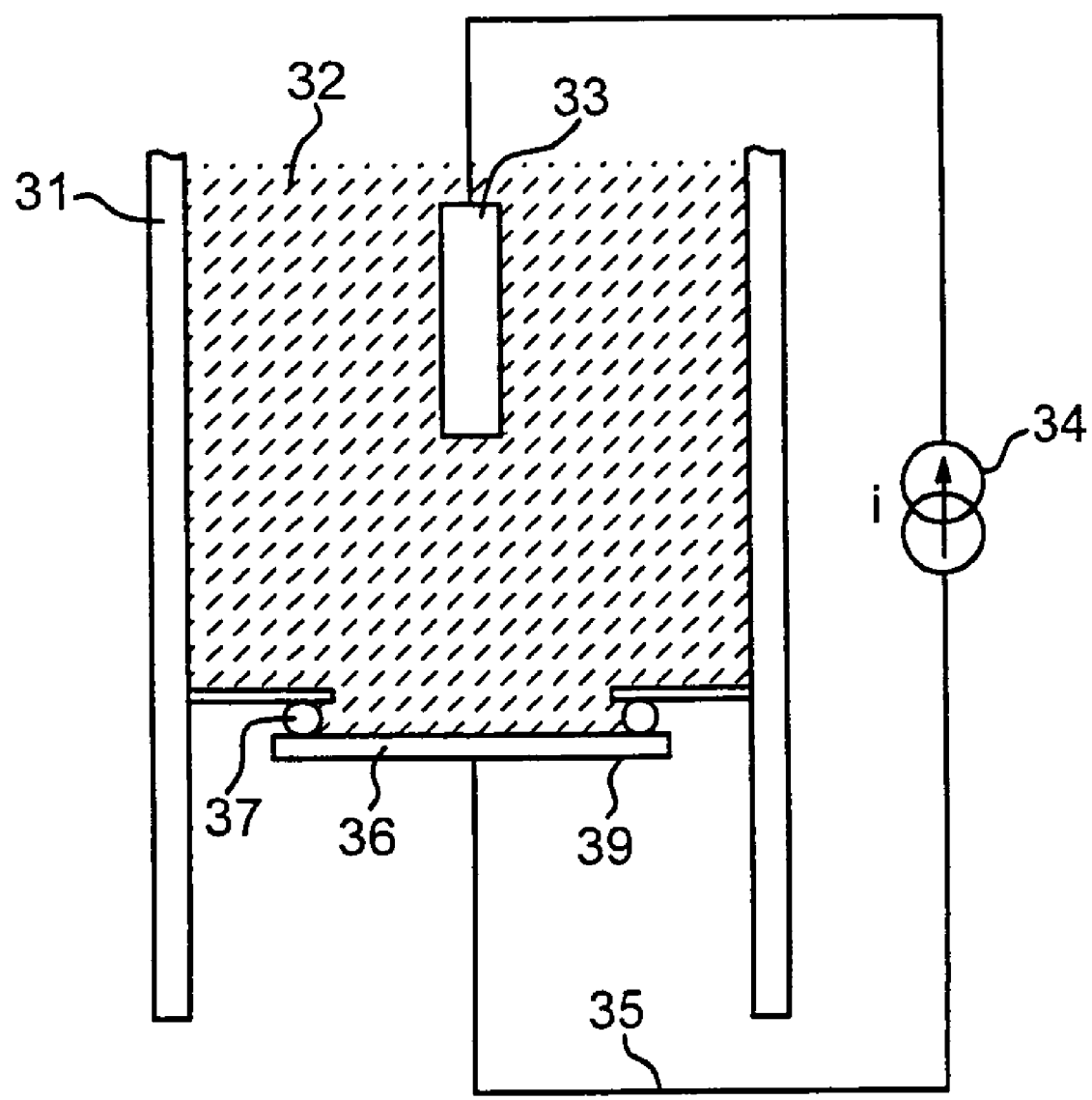
Figure 4B:
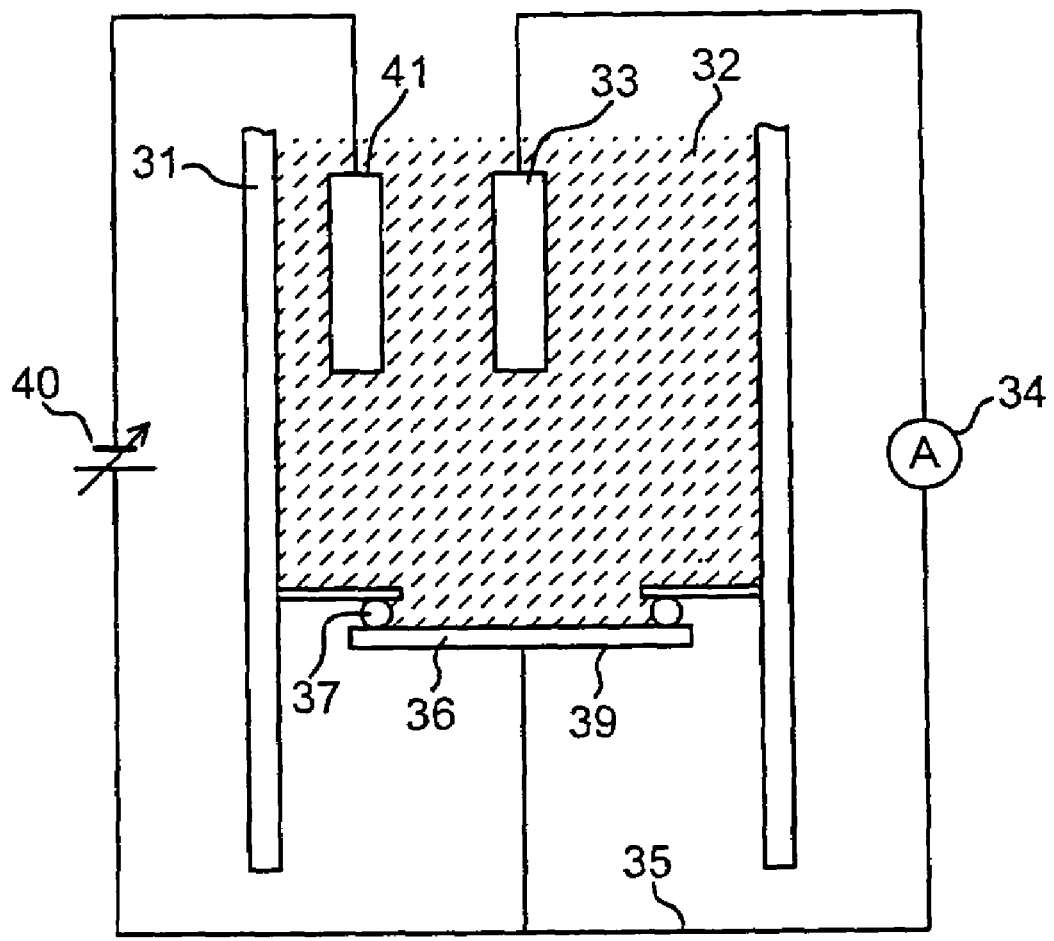

FIGS. 4A and 4B represent assemblies of electrolysis cells in which either the current (FIG. 4A) or the voltage (FIG. 4B) are controlled.

FIG. 4A represents:
- the chamber 31 of the electrolytic cell,
- an acid solution 32,
- a platinum cathode 33,
- a current source 34,
- electrical connection wires 35 to an aluminium layer 39,
- a silicon sample 36, for which the face with the pads is in the solution.
- a seal 37 isolating the back face of the substrate 36 from the electrolyte 32.

In the case of FIG. 4B, a voltage source 40, an electrode 41 and a current tester 42 are added.

The final step consists of depositing the recording material 23 (FIGS. 3A-3C and 3A'-3C') and may be a magnetic or phase change or polymer material or others. It may be deposited on the top of the pads using different techniques for example such as evaporation, DC or RF sputtering, etc. depending on the nature of the material and the required deposit.

Depending on the required pads size, and depending on the value and location of the porosity to be obtained, we can adapt:

the material doping (type and level),
amplitude and mode (DC or pulsed) of the voltage or current,
the HF concentration of the electrolyte,
illumination or non-illumination of the sample.

For example, an n type material is illuminated to make it porous. Thus, in the case shown in FIG. 3B, the back face of the n substrate structured into pads was illuminated.

Figure 3C:
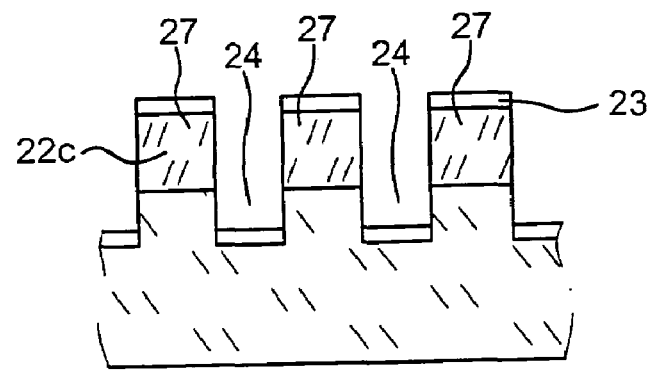
Figure 3A:
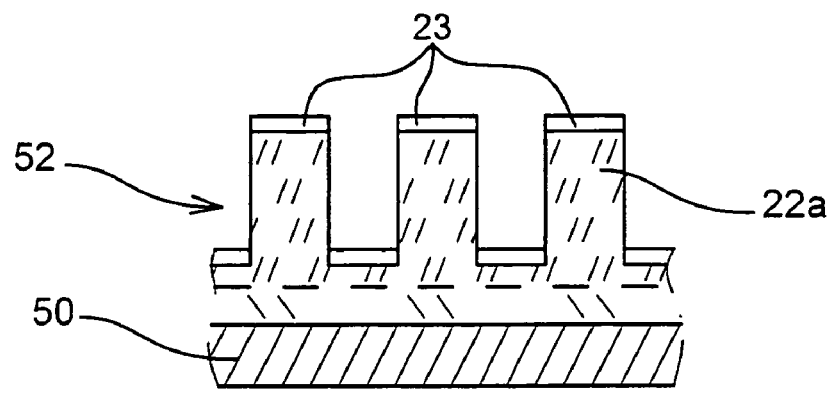
Figure 3B:
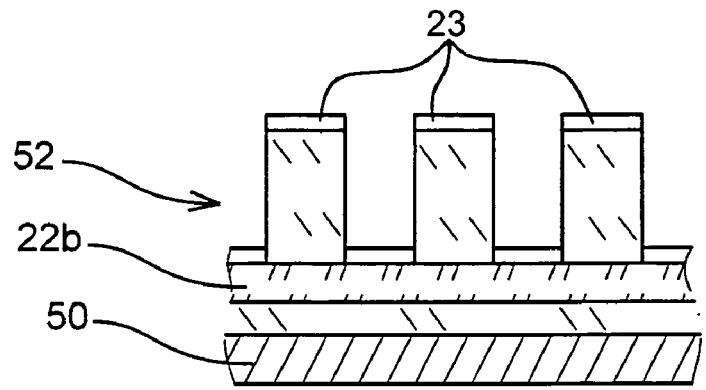
Figure 3C:
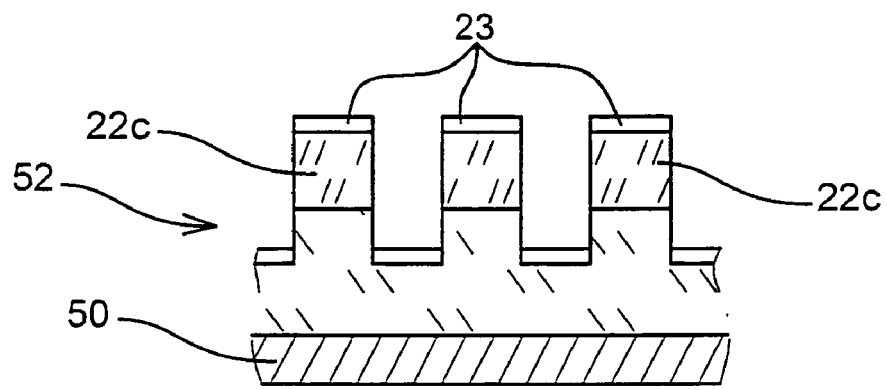

For the case in FIGS. 3C and 3C', the substrate is not illuminated but electrolysis conditions are chosen such that active chemical species between the pads are depleted. Only the tops of the pads then react with the electrolyte and are made porous.

The main advantages and usefulness of the invention are particularly as follows.

The structure is firstly technologically compatible with silicon and CMOS processes.

It is also compatible with most thermally assisted recording materials, for example such as magnetic materials, phase change materials and polymers.

The structure with pads enables:

compatibility with recording techniques under tip,
very good lateral thermal insulation,
a physical separation between bits, giving an improved signal-to-noise ratio,
a very good super paramagnetic limit in the case of a thermomagnetic recording (the volume to be considered is no longer the volume of a polycrystalline media grain, but rather the volume of the layer deposited on the top of pads).

The use of porous silicon makes it possible to:

achieve very low thermal conductivity values, and therefore very high thermal insulation values. Values of $\lambda th=0.03$ $W.m^{-1}.K^{-1}$ and $\lambda th=0.025$ $W.m^{-1}.K^{-1}$ have been reported in J. Phys. D, 30 (1997) 2911-2916 and Semiconductors, 31, (1997) 534-537 respectively, for nano-porous silicon porosities equal to 89% and 80% respectively, choose the required thermal insulation. This depends on porosity values that may be chosen simply by electrolysis conditions and the initial choice of silicon. Values of thermal conductivity may vary from more than about ten $W.m^{-1}.K^{-1}$ to previously given values, for example from 20 $W.m^{-1}.K^{-1}$ to 0.01 $W.m^{-1}.K^{-1}$ for all envisaged materials.

also to benefit from greater interface thermal resistances between the recording material and porous silicon. Porous silicon is an electrical insulator and the thermal conductivity can only be achieved by phonons. The difference in the crystalline arrangement between the recording material and the porous structure hinders the passage of phonons and leads to an internal thermal resistance.

to obtain high electrical resistances.

Finally, the surface condition is compatible with thin layer depositions.

Therefore, the invention relates to a thermally assisted recording device or support.

Such a device or support may be used with most recording materials that can be deposited in thin layers, and with most near field and traditional read/write techniques (optical, hard disks, etc.).

Thus, for example it can be used with different recording materials 23, for example such as:

magnetic materials with parallel or perpendicular magnetization. This magnetic medium may be coupled by exchange to an anti-ferromagnetic material or material with strong coercivity to increase the thermal stability,
or phase change materials,
or polymers such as ferroelectrical polymers.

It may also be used with different heating means, for example such as:

optical type means, for example an optical fiber,
or a heating tip, for example of the STM tip type (scanning tunneling microscope) or AFM (atomic force microscope), with or without contact.

The tip or the fiber is positioned above the substrate and is connected to the power supply or to an optical source and to means of displacing the tip or the fiber above the substrate.

Furthermore, porosification may be obtained by immersion in an acid bath.

The invention claimed is:

1. A recording medium comprising:
   a substrate made of a material, provided with pads,
   a layer of recording material covering in a discontinuous manner the pads and in a continuous manner the top of the pads, and
   thermal insulation zones located in at least one part of the pads and/or the substrate.

2. The recording medium according to claim 1, wherein said substrate is provided with pads being transferred onto a medium.

3. The recording medium according to claim 1, wherein said pads and said substrate are made of a single material.

4. The recording medium according to claim 1, wherein said material is a semiconductor.

5. The recording medium according to claim 4, wherein said semiconductor material is selected from the group consisting of silicon (Si), germanium (Ge), germanium silicide (SiGe), silicon carbide (SiC), gallium arsenide (GaAs), indium phosphide (InP) and gallium phosphide (GaP).

6. The recording medium according claim 4, wherein said thermal insulation zones are porous zones in the semiconducting material.

7. The recording medium according to claim 1, wherein the spaces between pads comprise thermally insulating material.

8. The recording medium according to claim 1, wherein said recording material is made of a magnetic material, or a phase change material or a polymer.

9. The recording medium according to claim 1, wherein said thermal insulation zones have a thermal conductivity between 20 $W.m^{-1}.K^{-1}$-0.01 $W.m^{-1}.K^{-1}$.

10. The recording medium according to claim 1, in which a pad height-to-pad diameter ratio, called the shape factor, is equal to 2.

11. A recording device comprising a recording medium according to claim 1 and an optical heating means.

12. A recording device comprising a recording medium according to claim 1 which comprises a heating tip.

13. The device according to claim 12, wherein said heating tip is of the AFM or STM type, with or without contact.

14. A process for making a recording medium comprising:
   producing pads on a substrate made of a material,
   forming thermal insulation zones in the pads and/or the substrate, and forming a layer of recording material, which is discontinuous on the pads and continuous on the top of the pads.

15. The process according to claim 14, wherein said pads are formed in the substrate material.

16. The process according to claim 14, wherein said pads are made in a layer added onto the substrate.

17. The process according to claim 14, wherein said substrate is made of a semiconducting material.

18. The process according to claim 17, wherein said semiconducting material is selected from the group consisting of silicon (Si), germanium (Ge), germanium silicide (SiGe), silicon carbide (SiC), gallium arsenide (GaAs), indium phosphide (InP) and gallium phosphide (GaP).

19. The process according to claim 17, wherein said thermal insulation zones are obtained by porosification of the semiconducting material.

20. The process according to claim 19, wherein porosification is obtained by anode oxidation or immersion in an acid bath.

* * * * *